(12) United States Patent
Hwang et al.

(10) Patent No.: US 12,031,205 B2
(45) Date of Patent: Jul. 9, 2024

(54) METHOD AND SYSTEM FOR FORMING A CONFORMAL SILICON CARBON NITRIDE LAYER AND STRUCTURE FORMED USING SAME

(71) Applicant: ASM IP Holding B.V., Almere (NL)

(72) Inventors: Ling Chi Hwang, Hachioji (JP); Makoto Igarashi, Fuchu (JP); Aurelie Kuroda, Chofu (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/990,779

(22) Filed: Nov. 21, 2022

(65) Prior Publication Data
US 2023/0167544 A1 Jun. 1, 2023

Related U.S. Application Data

(60) Provisional application No. 63/284,325, filed on Nov. 30, 2021.

(51) Int. Cl.
*C23C 16/36* (2006.01)
*C23C 16/04* (2006.01)
*C23C 16/34* (2006.01)
*C23C 16/513* (2006.01)

(52) U.S. Cl.
CPC .......... *C23C 16/045* (2013.01); *C23C 16/347* (2013.01); *C23C 16/513* (2013.01)

(58) Field of Classification Search
CPC ..... C23C 16/045; C23C 16/347; C23C 16/40; C23C 16/513
See application file for complete search history.

(56) References Cited

U.S. PATENT DOCUMENTS

| | | | |
|---|---|---|---|
| 8,569,184 B2 | 10/2013 | Oka | |
| 8,784,951 B2 | 7/2014 | Fukazawa | |
| 9,786,492 B2 | 10/2017 | Suzuki | |
| 10,340,135 B2 | 7/2019 | Blanquart | |
| 2014/0193983 A1* | 7/2014 | LaVoie | C23C 16/45525 118/704 |
| 2015/0147484 A1* | 5/2015 | Nguyen | C23C 16/45536 427/535 |
| 2015/0162185 A1* | 6/2015 | Pore | C23C 16/45553 438/786 |
| 2016/0307751 A1* | 10/2016 | Pore | H01L 21/02208 |
| 2017/0051405 A1* | 2/2017 | Fukazawa | C23C 16/045 |

(Continued)

OTHER PUBLICATIONS

Chang, Shou-Yi, et al., "Effect of Plasma Treatments on the Interface Chemistry and Adhesion Strength Between Cu Metallization and SiCN Etch Stop Layer". Journal of The Electrochemical Society, 154 (4) D241-D248 (2007).*

(Continued)

*Primary Examiner* — Bret P Chen
(74) *Attorney, Agent, or Firm* — Snell & Wilmer L.L.P.

(57) ABSTRACT

A method and system for forming a conformal silicon carbon nitride layer overlying a gap on a surface of a substrate are disclosed. Exemplary methods include forming conformal silicon carbon nitride material within the gap and treating the conformal silicon carbon nitride material to form treated silicon carbon nitride material. The deposition time is relatively short to mitigate flow of the conformal silicon carbon nitride material within the gap.

16 Claims, 5 Drawing Sheets

(56) References Cited

U.S. PATENT DOCUMENTS

| | | | | |
|---|---|---|---|---|
| 2018/0047568 A1* | 2/2018 | Nguyen | ............... | H01L 21/0234 |
| 2021/0189555 A1* | 6/2021 | Shek | ................... | C01B 21/0828 |
| 2021/0225634 A1* | 7/2021 | Sharma | ............... | H01L 21/0228 |
| 2021/0388008 A1* | 12/2021 | Chen | ................... | H01L 21/0214 |
| 2021/0388499 A1* | 12/2021 | Zhang | ................. | H01L 21/0228 |

OTHER PUBLICATIONS

Tsai, Hung-Chun, et al., "Effect of plasma treatments on interface adhesion between SiOCH ultra-low-k film and SiCN etch stop layer". Microelectronic Engineering 85 (2008) 1658-1663.*

Chen, C.W., et al., "Effects of Oxygen Plasma Ashing on Barrier Dielectric SiCN Film". Electrochemical and Solid-State Letters, 8 (1) G11-G13 (2005).*

Lee, Woo-Jin, et al., "Highly conformal carbon-doped SiCN films by plasma-enhanced chemical vapor deposition with enhanced barrier properties". Thin Solid Films 657 (2018) 32-37.*

Smirnova, T.P., et al., "SiCN alloys obtained by remote plasma chemical vapour deposition from novel precursors". Thin Solid Films, 429 (2003) 144-151.*

Wrobel, Aleksander M., et al., "Silicon Carbonitride (SiCN) Films by Remote Hydrogen Microwave Plasma CVD from Tris(dimethylamino)silane as Novel SingleSource Precursor". Chemical Vapor Deposition, 2010, 16, 211-215.*

\* cited by examiner

METHOD AND SYSTEM FOR FORMING A CONFORMAL SILICON CARBON NITRIDE LAYER AND STRUCTURE FORMED USING SAME

CROSS-REFERENCE TO RELATED APPLICATIONS

This application claims priority to U.S. Provisional Patent Application Ser. No. 63/284,325 filed Nov. 30, 2021 titled METHOD AND SYSTEM FOR FORMING A CONFORMAL SILICON CARBON NITRIDE LAYER AND STRUCTURE FORMED USING SAME, the disclosure of which is hereby incorporated by reference in its entirety.

FIELD OF INVENTION

The present disclosure generally relates to methods and systems suitable for the formation of devices. More particularly, the disclosure relates to methods for depositing material on a surface of a substrate, to systems for depositing the material, and to structures including the material.

BACKGROUND OF THE DISCLOSURE

During the formation of devices, such as semiconductor devices, it is often desirable to form patterned features on a surface of a substrate. Typically, to form patterned features, a layer of material is deposited, the deposited layer is then patterned using, for example, photolithography techniques, and then portions of the layer etched to formed features including the material.

Etch stop layers are used in some applications to limit an etch process from proceeding to an underlying layer. In some cases, etch stop layers can be used overlying features, such as gaps, to form desired structures suitable for use in the manufacture of devices. Recently, silicon carbon nitride has gained interest as a material suitable for use as an etch stop layer, because silicon carbon nitride exhibits a relatively high resistance to etchants typically used to etch other materials, such as silicon oxide and silicon nitride.

Techniques to deposit conformal silicon carbon nitride often require relatively high temperatures (e.g., higher than 600° C.). For many applications, it may be desirable to deposit (e.g., conformal) silicon carbon nitride at a lower temperature. Accordingly, improved methods and systems are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods for depositing a silicon carbon nitride layer. More particularly, the disclosure relates to methods and systems for conformally depositing a silicon carbon nitride layer. While the ways in which various embodiments of the present disclosure address drawbacks of prior methods and structures are discussed in more detail below, in general, embodiments of the disclosure provide improved methods suitable for conformally depositing a silicon carbon nitride layer at a relatively low temperature.

In accordance with exemplary embodiments of the disclosure, a method of forming a conformal silicon carbon nitride layer is provided. The method can be used to form the conformal silicon carbon nitride layer overlying a gap on a surface of a substrate. In accordance with various examples, the method includes providing the substrate comprising one or more gaps within a reaction chamber; providing at least one of a nitrogen reactant and a noble gas to the reaction chamber; providing a silicon precursor to the reaction chamber; during an overlap period of the steps of providing at least one of a nitrogen reactant and a noble gas and providing the silicon precursor, providing plasma power for a deposition period to thereby form conformal silicon carbon nitride material within the gap; and using a plasma process for a treatment period, treating the conformal silicon carbon nitride material to form treated silicon carbon nitride material. The method can further include repeating the steps of providing plasma power for a deposition period and treating the conformal silicon carbon nitride material to form the conformal silicon carbon nitride layer. The method can be performed with a temperature within the reaction chamber (e.g., a temperature of a substrate) of less than 400° C. In accordance with further examples, a duration of the deposition period is less than 5 seconds. A thickness of the carbon nitride material deposited during the deposition period can be between about 1 nm and about 6 nm or about 2 nm and about 4 nm. As set forth in more detail below, exemplary silicon precursors can be or include compounds comprising $Si_xC_yN_z$, where x ranges from about 1 to about 5 or about 1 to about 3, where y ranges from about 1 to about 10 or about 1 to about 6, and where z ranges from about 1 to about 5 or about 1 to about 3. In accordance with further examples, the silicon precursor comprises one or more of a Si—C bond and a Si—N bond. Particular exemplary silicon precursors are discussed in more detail below. In accordance with additional examples of the disclosure, the nitrogen reactant is selected from the group consisting of $N_2$, $NH_3$, and a mixture of $N_2$ and $H_2$. The noble gas can be or include, for example, one or more of argon and helium. In accordance with further examples, a plasma time and/or power during the step of treating the conformal silicon carbon nitride material is higher than a plasma power during the step of providing plasma power for a deposition period. In accordance with further examples of the disclosure, a hydrogen-containing gas is provided to the reaction chamber during the treatment period. Additionally or alternatively, a noble treatment gas is provided to the reaction chamber during the treatment period. The noble treatment gas can include, for example, helium.

In accordance with additional embodiments of the disclosure, a structure includes a substrate and a conformal silicon carbon nitride layer—e.g., formed according to a method as described herein. The silicon carbon nitride layer can include between about 2 and about 50 at % carbon or between about 5 and about 25 at % carbon. Additionally or alternatively, the silicon carbon nitride layer can include between about 10 and about 60 at % silicon or between about 20 and about 40 at % silicon. Additionally or alternatively, the silicon carbon nitride layer comprises between about 5 and about 40 at % nitrogen or between about 20 and about 40 at % nitrogen.

In accordance with further examples of the disclosure, a system is provided. The system can be configured to perform a method as described herein and/or to form a structure as described herein.

These and other embodiments will become readily apparent to those skilled in the art from the following detailed description of certain embodiments having reference to the attached figures; the invention not necessarily being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
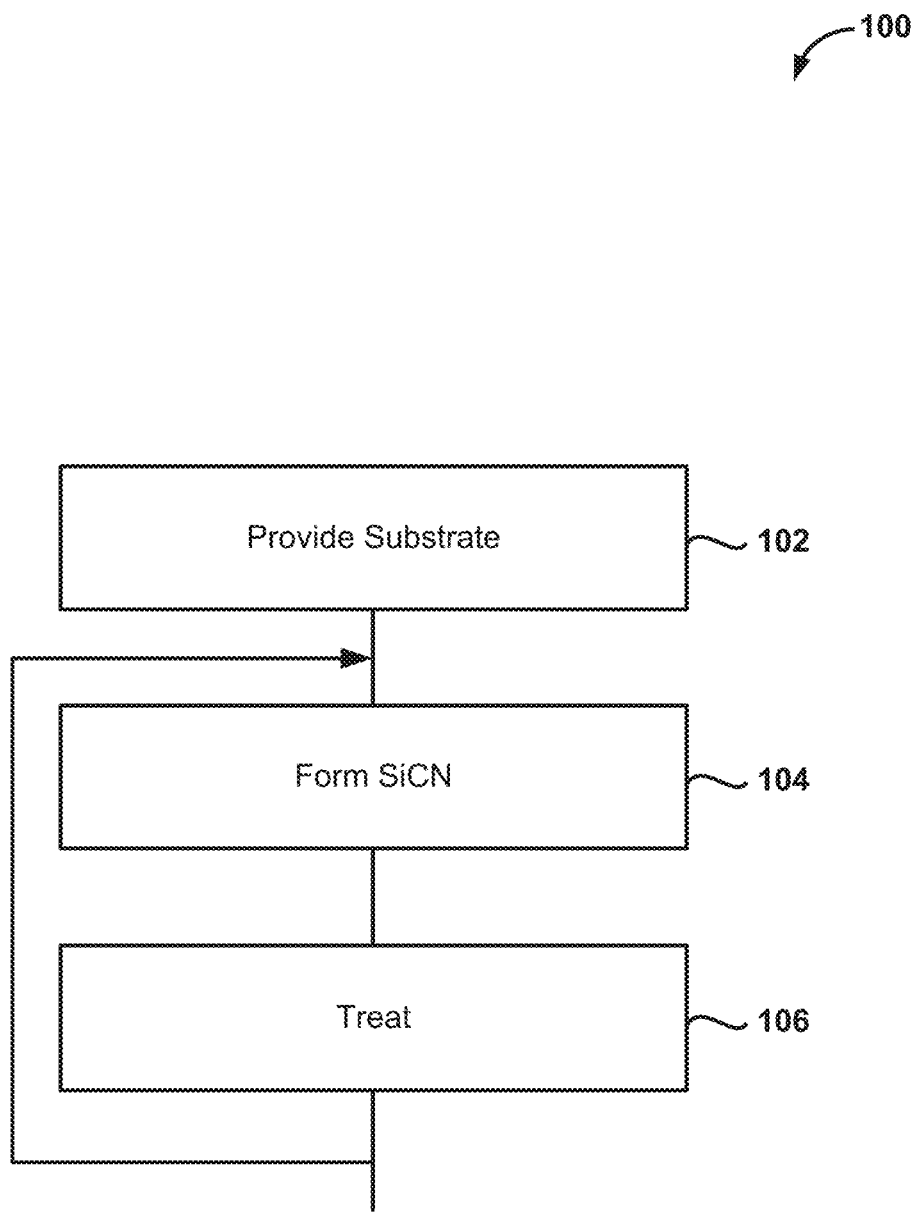
FIG. 1 illustrates a method in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to deposition methods, structures formed using the methods, and systems that can be used to perform the methods and/or form the structures. As described in more detail below, exemplary methods can be used to form device structures suitable for forming electronic devices. For example, exemplary methods can be used to form features that include conformally-deposited silicon carbon nitride material suitable for use as, for example, an etch stop layer. Unless otherwise noted, examples of the disclosure are not necessarily limited to such applications.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent, a gas that can excite a precursor when plasma power is applied, and/or a gas that may be used to treat (e.g., densify) a material. When used to excite a precursor, an inert gas can be considered a reactant. In some cases, the terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various structures, such as recesses, vias, lines, and the like formed within or on at least a portion of a layer of the substrate.

In this disclosure, a recess between adjacent protruding structures and any other recess pattern may be referred to as a "gap." That is, a gap may refer to any recess pattern, including a hole/via, region between lines, and the like. A gap can have, in some embodiments, a width of about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a gap has an aspect ratio of about 2 to about 10, and typically of about 2 to about 5. The dimensions of the gap may vary depending on process conditions, film composition, intended application, and the like.

As used herein, the term cyclical chemical vapor deposition may refer to any process wherein a substrate is sequentially exposed to two or more volatile precursors, which react and/or decompose on a substrate to produce a desired deposition. In some cases, cyclical chemical vapor deposition can be referred to as pulsed chemical vapor deposition, where one or more precursors, reactants, and/or a plasma power may be pulsed. In some cases, one or more of the precursors and/or reactants may be continuously flowed and/or a plasma power may be continuously provided during one or more deposition and/or treatment cycles, described below.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers. The terms film and layer can be used interchangeably.

In this disclosure, continuously can refer to one or more of without breaking a vacuum, without interruption as a timeline, without any material intervening step, without changing treatment conditions, immediately thereafter, as a next step, or without an intervening discrete physical or chemical structure or layer between two structures or layers in some embodiments. For example, a reactant and/or an inert or noble gas can be supplied continuously during two or more steps and/or cycles of a method.

As used herein, the term purge may refer to a procedure in which an inert or substantially inert gas (i.e., a gas that does not take part in a chemical reaction to an appreciable extent) is provided to a reactor chamber between pulses of other (e.g., reactant or precursor) gases. For example, a purge may be provided between a deposition period and a treatment period, thus avoiding or at least reducing gas phase interactions between the precursor and the reactant during a treatment period. It shall be understood that a purge can be effected either in time or in space or both. For example, in the case of temporal purges, a purge step can be used, e.g., in the temporal sequence of providing a precursor to a reactor chamber, ceasing the flow of the precursor, and providing a purge gas to the reactor chamber, wherein the substrate on which a layer is deposited may not move. In the case of spatial purges, a purge step can take the form of moving a substrate from a first location to which a first precursor is supplied, through a purge gas curtain, to a second location to which a treatment gas is supplied.

As used herein, silicon carbon nitride (SiCN) can refer to material that includes silicon, carbon, and nitrogen. Unless stated otherwise, SiCN is not intended to limit, restrict, or define the bonding or chemical state, for example, the oxidation state of any of Si, C, N, and/or any other element in the film. In some embodiments, SiCN thin films may comprise one or more elements in addition to Si, C, and N, such as H. In some embodiments, the SiCN films may comprise Si—C bonds and/or Si—N bonds (e.g., that were present in a precursor). In some embodiments, the SiCN films may comprise Si—H bonds in addition to Si—C and/or Si—N bonds. In some embodiments, the SiCN films may comprise from greater than 0% to about 50% carbon on an atomic basis. In some embodiments, the SiCN films may comprise from about 0.1% to about 40%, from about 0.5% to about 30%, from about 1% to about 30%, from about 5% to about 20%, between about 2 and about 50 at % carbon or between about 5 and about 25 at % carbon on an atomic basis. In some embodiments, the SiCN films may comprise from greater than 0% to about 70% nitrogen on an atomic basis. In some embodiments, the SiCN films may comprise from about 10% to about 70%, from about 15% to about 50%, from about 20% to about 40%, or between about 5 and about 40 at % nitrogen or between about 20 and about 40 at % nitrogen on an atomic basis. In some embodiments, the SiCN films may comprise greater than 0% to about 50% silicon on an atomic basis. In some embodiments, the SiCN films may comprise from about 10% to about 50%, from about 15% to about 40%, from about 20% to about 35%, or between about 10 and about 60 at % silicon or between about 20 and about 40 at % silicon on an atomic basis. In some embodiments, the SiCN films may comprise from about 0.1% to about 40%, from about 0.5% to about 30%, from about 1% to about 30%, or from about 5% to about 20% hydrogen on an atomic basis. In some embodiments, the SiCN films may not comprise oxygen. The compositions set forth above can be for conformal silicon carbon nitride material and/or a conformal silicon carbon nitride layer.

In some cases, a conformal layer exhibits a step coverage equal to or greater than 50%, or greater than 80%, or greater than 90%, or greater than 100%, or greater than 110%, or greater than 150%, or between 75 and 125% or between 90 and 110% in/on structures having aspect ratios (height/width) of more than about 2, more than about 5, more than about 10, more than about 25, more than about 50, more than about 100, or between about 10 and 100 or about 5 and 25. It shall be understood that the term "step coverage" refers to a thickness of a layer on a distal surface of a recess, divided by the thickness of that layer on a proximal surface of the recess, and is expressed as a percentage. It shall be understood that a distal portion of the gap feature refers to a portion of the gap feature that is relatively far removed from a substrate's surface, and that the proximal portion of a gap feature refers to a part of the gap feature which is closer to the substrate's surface compared to the distal/lower/deeper portion of the gap feature.

As used herein, the term overlap can mean coinciding with respect to time and within a reaction chamber. For example, with regard to gas pulse periods or steps, such as precursor pulse periods and reactant pulse periods (or corresponding steps), two or more gas pulse periods or steps can overlap when gases from the respective pulse periods or steps are within the reaction chamber or provided to the reaction chamber for a period of time.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like, in some embodiments. Further, in this disclosure, the terms "including," "constituted by" and "having" can refer independently to "typically or broadly comprising," "comprising," "consisting essentially of," or "consisting of" in some embodiments. In accordance with aspects of the disclosure, any defined meanings of terms do not necessarily exclude ordinary and customary meanings of the terms.

Figure 2:
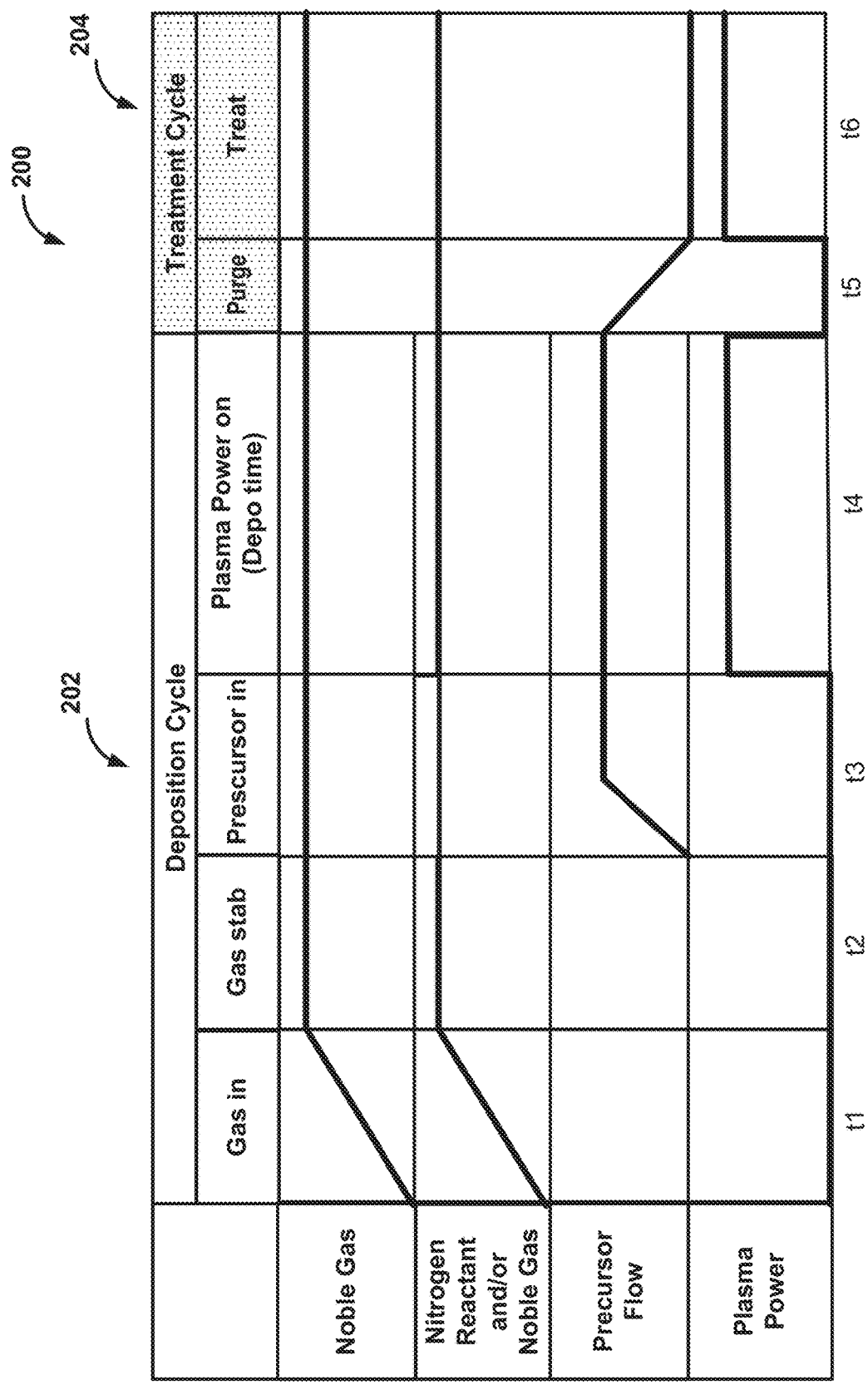
FIG. 2 illustrates a timing sequence suitable for use with the method illustrated in FIG. 1.

Turning now to the figures, FIG. 1 illustrates a method 100 of forming a conformal silicon carbon nitride layer in accordance with examples of the disclosure. Method 100 can be used to form the conformal silicon carbon nitride layer overlying a gap on a surface of a substrate. As illustrated, method 100 includes the steps of providing the substrate comprising the gap within a reaction chamber (step 102), forming conformal silicon carbon nitride material (step 104), and treating the conformal silicon carbon nitride material to form treated silicon carbon nitride material (step 106). FIG. 2 illustrates a timing sequence 200 suitable for use with method 100 and FIGS. 3-7 illustrate structures formed using method 100 and/or sequence 200.

During step 102, the substrate comprising the gap is provided within a reaction chamber of a reactor system. In accordance with examples of the disclosure, the reaction chamber can form part of a cyclical deposition reactor, such as a cyclical chemical vapor deposition reactor, and particularly a plasma-enhanced CVD reactor. Various steps of method 100 can be performed within a single reaction chamber or can be performed in multiple reaction chambers, such as reaction chambers of a cluster tool or a process module. A reactor including the reaction chamber can be provided with a heater to activate the reactions by elevating the temperature of one or more of the substrate, the reaction chamber wall, and/or the reactants/precursors.

Figure 3:
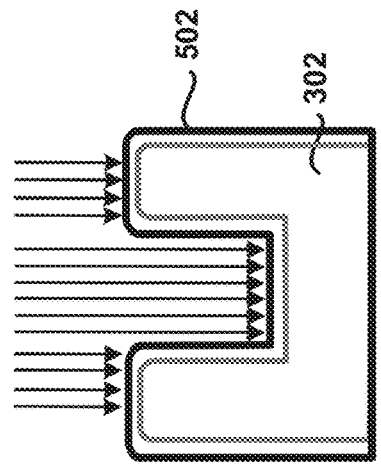
FIGS. 3-6 illustrate structures in accordance with examples of the disclosure.
Figure 4:
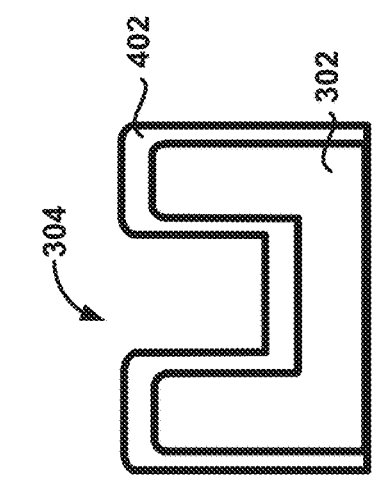

An exemplary substrate 302 provided during step 102 is illustrated in FIG. 3. As illustrated, substrate 302 includes a gap 304 on a surface 306 of substrate 302. Gap 304 includes a top surface 308, a bottom surface 310, and a sidewall 312 therebetween. Gap 304 can be formed, for example, as a via, between lines or protrusions, from part of another gap or recess, or the like. In some cases (e.g., for a via), sidewall 312 can span gap 304, and in other cases, a gap (e.g., between lines or protrusions) can include a plurality of sidewalls 312.

During step 102, the substrate can be brought to a desired temperature and pressure for step 104. By way of examples, a temperature (e.g., of a substrate or a substrate support) within a reaction chamber can be between less than 400° C., less than 300° C., less than 250° C., and/or between about 50° C. and about 250° C. or about 70° C. and about 150° C. A pressure within the reaction chamber can be about 0.1 to about 10 or about 10 to about 100 Torr.

During step 104, conformal silicon carbide nitride material is formed overlying the substrate—e.g., overlying gap 304. In accordance with various examples of the disclosure, step 104 includes providing at least one of a nitrogen reactant and a noble gas to the reaction chamber, providing a silicon precursor to the reaction chamber, and during an overlap period of the steps of providing at least one of a nitrogen reactant and a noble gas and providing the silicon precursor, providing plasma power for a deposition period to thereby form conformal silicon carbide nitride material within the gap.

With reference to FIG. 2, timing sequence 200 includes a deposition cycle 202 and a treatment cycle 204. Deposition cycle 202 can be the same or similar to step 104. In the illustrated example, deposition cycle 202 includes a gas in period (t1), a gas stabilization period (t2), a precursor in period (t3), and deposition plasma power period (t4).

During gas in period (t1), a first noble gas and at least one of a nitrogen reactant and another noble gas are provided to the reaction chamber. The first noble gas and/or the another noble gas can include, for example, argon (Ar), helium (He), a combination thereof, or the like. The nitrogen reactant can be selected from the group consisting of $N_2$, $NH_3$, and a mixture of $N_2$ and $H_2$ (e.g., a mixture comprising between 0% and 100% $N_2$ and/or between 0% and 50% $H_2$). A flowrate of the first noble gas can ramp to between about 0 and about 10,000 or about 500 and about 4000 sccm. A flowrate of the at least one of a nitrogen reactant and the another noble gas can ramp to between about 0 and about 10,000 or about 500 and about 2000 sccm. A duration of t1 can range from about 5 to about 30 seconds.

During gas stabilization period (t2), a pressure and/or temperature within the reaction chamber can stabilize—e.g., to a pressure and/or temperature noted above in connection with step 102. In addition, flowrates of the first noble gas and the at least one of a nitrogen reactant and the another noble gas can stabilize—e.g., to a flowrate noted above. A duration of t2 can range from about 5 to about 60 seconds.

During precursor in period (t3), a silicon precursor is provided to the reaction chamber and the flowrate of the silicon precursor is allowed to stabilize. A flowrate of the precursor can be between about 100 and about 2000 or about 100 and about 1000 sccm. A duration of t3 can range from about 1 to about 30 seconds.

A silicon precursor provided during step 104/t3 can be a compound represented by the formula: $Si_xC_yN_z$, where x ranges from about 1 to about 4 or about 2 to about 3, where y ranges from about 1 to about 15 or about 1 to about 8, and where z ranges from about 1 to about 4 or about 1 to about 3; additional exemplary ranges for x, y, and z are provided above. In accordance with further examples, the silicon precursor comprises one or more of a Si—C bond and a Si—N bond.

In accordance with examples of the disclosure, the silicon precursor is represented by the general formula:

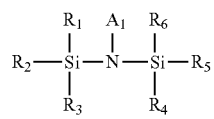

-continued

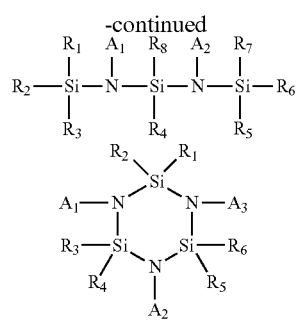

where $R_1$-$R_8$ are independently selected from groups comprising at least one of C, N, H, where at least one of $R_1$-$R_8$ comprises C, and where $A_1$-$A_3$ are independently selected from groups comprising or consisting of C and H (e.g., a C1-C3 hydrocarbon or H). For example, each $R_1$-$R_8$ can be independently selected groups represented by $C_xN_yH_z$, where x ranges from about 0 to about 3 or about 0 to about 2, where y ranges from about 0 to about 2 or about 0 to about 1, and where z ranges from about 3 to about 9 or about 3 to about 6.

In accordance with additional examples of the disclosure, the silicon precursor is represented by the general formula:

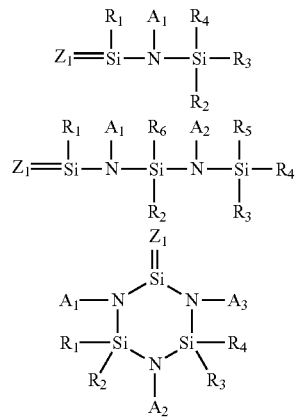

where $R_1$-$R_6$ are independently selected from groups comprising at least one of C, N, H, where $Z_1$ comprises or consists of C and H (e.g., a C1-C3 hydrocarbon or H), and where $A_1$-$A_3$ are independently selected from groups comprising or consisting of at least one of C and H (e.g., a C1-C3 hydrocarbon or H). Each $R_1$-$R_6$ can be independently selected groups represented by $C_xN_yH_z$, where x ranges from about 0 to about 3 or about 0 to about 2, where y ranges from about 0 to about 2 or about 0 to about 1, and where z ranges from about 3 to about 9 or about 3 to about 6.

In accordance with yet further examples of the disclosure, the silicon precursor is represented by the general formula:

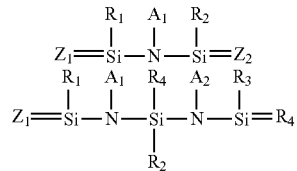

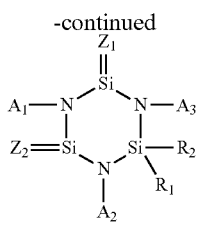

where $R_1$-$R_4$ are independently selected from groups comprising at least one of C, N, H, where $Z_1$ and $Z_2$ comprise C and H (e.g., a C1-C4 hydrocarbon or H), and where $A_1$-$A_3$ are independently selected from groups comprising at least one of C and H (e.g., a C1-C4 hydrocarbon or H). For example, each $R_1$-$R_4$ can be independently selected groups represented by $C_xN_yH_z$, where x ranges from about 0 to about 3 or about 0 to about 2, where y ranges from about 0 to about 2 or about 0 to about 1, and where z ranges from about 3 to about 9 or about 3 to about 6.

With continued reference to FIG. 2, during deposition plasma power period t4, plasma power is provided within the reaction chamber to form a plasma. Exemplary plasma power during deposition period t4 can be between about 50 and about 1000 W or between about 75 and about 400 W—e.g., for a 300 mm substrate (e.g., wafer). The power levels can be suitably scaled based on a size (e.g., diameter) of the substrate. As illustrated in FIG. 2, t4 represents an overlap period of the steps of providing at least one of a nitrogen reactant and a noble gas, providing the silicon precursor, and providing plasma power for a deposition period. During t4, conformal silicon carbon nitride material (e.g., conformal silicon carbon nitride material 402, illustrated in FIG. 4) is formed within the gap (e.g., gap 304).

In accordance with examples of the disclosure, a duration of the deposition period t4 is greater than 0 and less than 60 seconds or less than 20 seconds. Additionally or alternatively, a thickness of the carbon nitride material deposited during the deposition period is between about 1 nm and about 6 nm or about 2 nm and about 4 nm. The deposition time and/or thickness of material deposited may be relatively low to mitigate flow of the silicon carbon nitride material to thereby allow conformal deposition of the silicon carbon nitride material.

Figure 5:
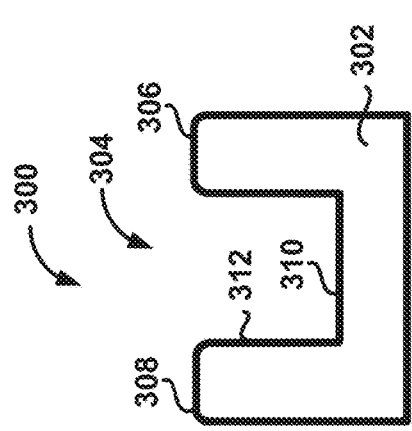

Referring again to FIG. 1 and to FIG. 5, once a desired initial amount of conformal silicon carbon nitride material is deposited, method 100 proceeds to step 106 of using a plasma process for a treatment period, treating the conformal silicon carbon nitride material to form treated silicon carbon nitride material 502. FIG. 2 illustrates a treatment cycle 204 suitable for use as step 106.

Treatment cycle 204 can include an optional purge period t5 and a treatment period t6. During purge period t5, one or more of the noble gas(es) and/or the nitrogen reactant can continue to flow to the reaction chamber—e.g., at the flowrates noted above. During this period, the plasma power is off. Further, the silicon precursor flow to the reaction chamber is ceased, such that the silicon precursor can be purged from the reaction chamber. A noble treatment gas comprising helium can be provided during period t5 and/or t6.

During treatment period t6, the conformal silicon carbon nitride material is treated with plasma-activated species to form treated silicon carbon nitride material 502. A duration of t6 can be between about 3 and about 100 or between about 5 and about 45 seconds.

In accordance with examples of the disclosure, a plasma power during the step of treating the conformal silicon carbon nitride material (step 106/t6) is higher than a plasma power during the step of providing plasma power for a deposition period (t4). By way of examples, a plasma power during the step of treating the conformal silicon carbon nitride material 106 can be about 35 or about 800 percent higher and/or be between about 50 and about 1000 W or about 150 and about 700 W—e.g., for a 300 mm substrate.

Although not separately illustrated, in some cases, a hydrogen-containing gas is provided to the reaction chamber during step 106/t6. Exemplary hydrogen-containing gases include hydrogen ($H_2$), ammonia ($NH_3$), hydrogen/nitrogen ($H_2/N_2$)—e.g., in compositions noted above.

Figure 6:
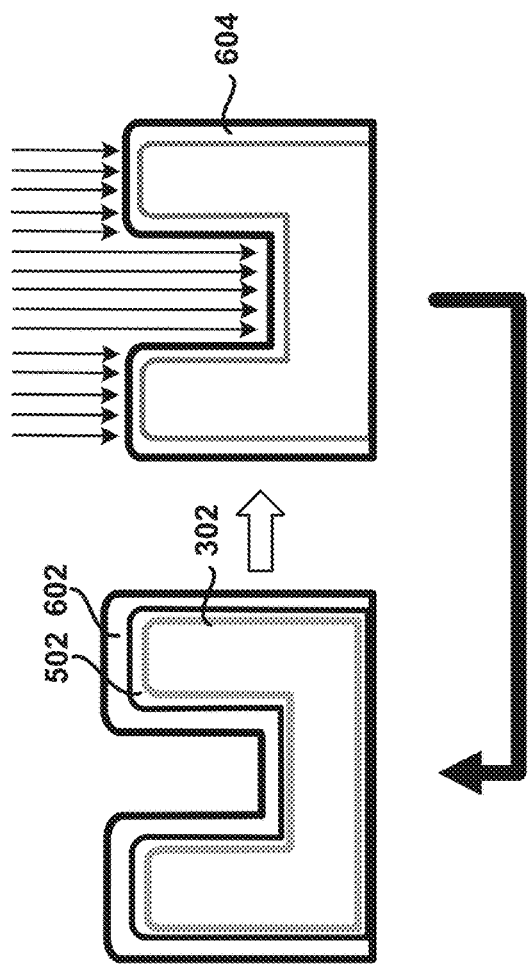

With reference to FIGS. 1 and 6, steps 104 and 106 can be repeated one or more times to form the conformal silicon carbon nitride layer. For example, another conformal silicon carbon nitride material 602 can be formed within gap 304 and overlying treated silicon carbon nitride material 502. Conformal silicon carbon nitride material 602 can be formed as described above in connection with step 104. Conformal silicon carbon nitride material 602 can be treated as described above in connection with step 106 to form conformal silicon carbon nitride layer 604. Steps 104 and 106 can be repeated to form a desired thickness of conformal silicon carbon nitride layer. For example, a thickness of the conformal silicon carbon nitride layer can be greater than 0 and less than 20 nm.

Figure 7:
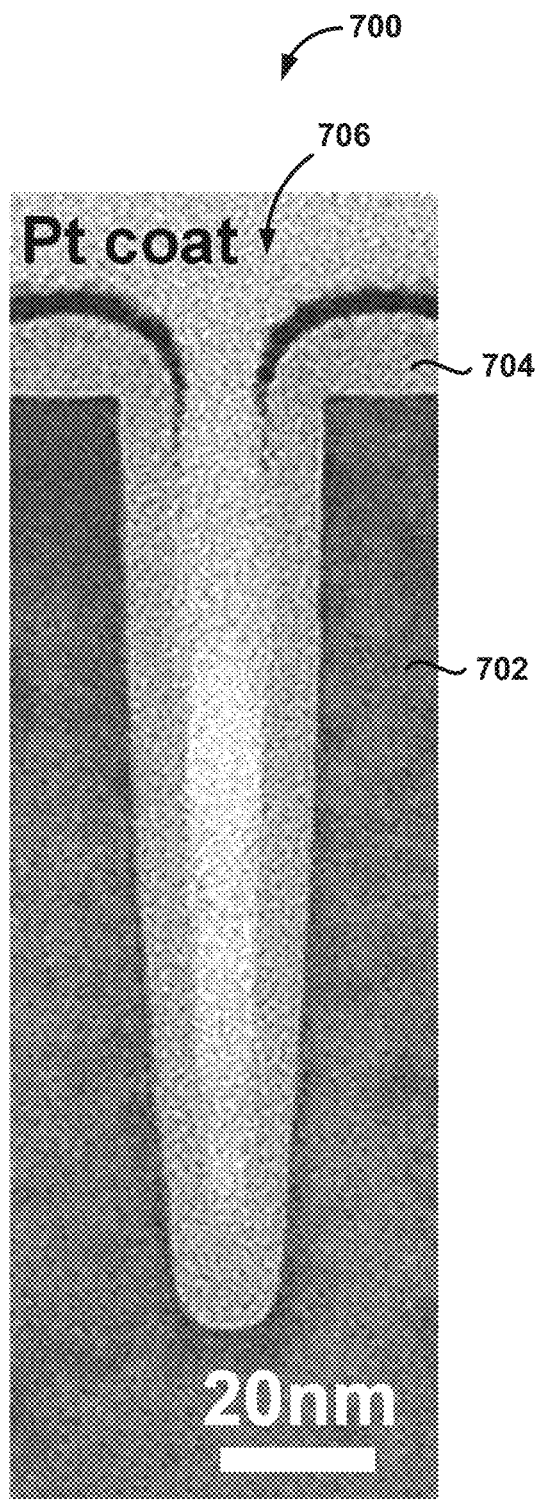
FIG. 7 illustrates another structure in accordance with examples of the disclosure.

FIG. 7 illustrates another structure 700 formed according to method 100. As illustrated, structure 700 includes a substrate 702 and a conformal silicon carbon nitride layer 704 formed overlying a gap 706 according to method 100 and/or sequence 200. A composition of conformal silicon carbon nitride layer 704 can be as noted above.

Figure 8:
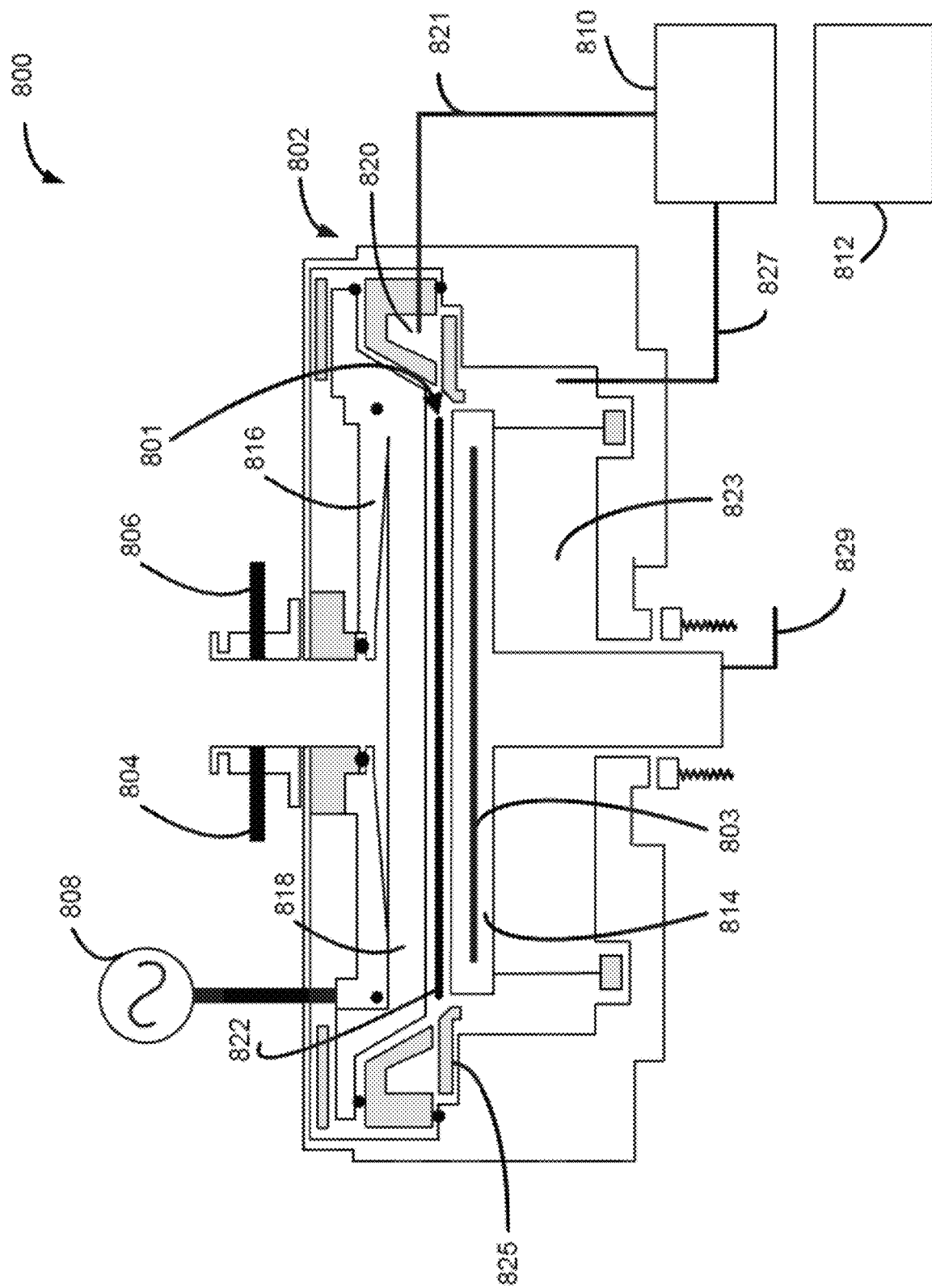
FIG. 8 illustrates a system in accordance with at least one embodiment of the disclosure.

Turning now to FIG. 8, a reactor system 800 in accordance with exemplary embodiments of the disclosure is illustrated. Reactor system 800 can be used to perform one or more steps or substeps as described herein and/or to form one or more structures or portions thereof as described herein.

Reactor system 800 includes a pair of electrically conductive flat-plate electrodes 814, 818 in parallel and facing each other in an interior 801 (reaction zone) of a reactor 802. Although illustrated with one reactor 802, system 800 can include two or more reactors. A plasma can be excited within a reaction chamber 801 by applying, for example, RF power from plasma power source(s) 808 to one electrode (e.g., electrode 818) and electrically grounding the other electrode (e.g., electrode 814). A temperature regulator 803 can be provided in a lower stage 814 (the lower electrode), and a temperature of a substrate 822 placed thereon can be kept at a desired temperature, such as the temperatures noted above. Electrode 818 can serve as a gas distribution device, such as a shower plate or showerhead. Precursor gases, reactant gases, and a carrier or inert (e.g., noble) gas, if any, or the like can be introduced into reaction chamber 802 using one or more gas lines (e.g., reactant gas line 804 and precursor gas line 806, respectively, coupled to a reactant (or noble gas) source and a precursor source). For example, an inert gas and a reactant (e.g., as described above) can be introduced into reaction chamber 801 using line 804 and/or a precursor and a carrier gas (e.g., an inert gas as described above) can be introduced into the reaction chamber using line 806. Although illustrated with two inlet gas lines 804, 806, reactor system 800 can include any suitable number of gas lines.

In reactor 802, a circular duct 820 with an exhaust line 821 can be provided, through which gas in reaction chamber 801 can be exhausted to an exhaust source 810. Additionally, a transfer chamber 823 can be provided with a seal gas line 829 to introduce seal gas into the interior of reactor 802 via the interior (transfer zone) of transfer chamber 823, wherein a separation plate 825 for separating the reaction zone or reaction chamber 801 and the transfer chamber 823 can be provided (a gate valve through which a substrate is transferred into or from transfer chamber 823 is omitted from this figure). Transfer chamber 823 can also be provided with an exhaust line 827 coupled to an exhaust source 810. In some embodiments, continuous flow of a carrier gas to reaction chamber 802 can be accomplished using a flow-pass system (FPS).

Reactor system 800 can include one or more controller(s) 812 programmed or otherwise configured to cause one or more method steps as described herein to be conducted. Controller(s) 812 are coupled with the various power sources, heating systems, pumps, robotics and gas flow controllers, or valves of the reactor, as will be appreciated by the skilled artisan. By way of example, controller 812 can be configured to control gas flow of a precursor, a reactant, and/or an inert gas into at least one of the one or more reaction chambers to form a layer on a surface of a substrate. Controller 812 can be further configured to provide power (e.g., RF power) to form a plasma—e.g., within reaction chamber 801. Controller 812 can be similarly configured to perform additional steps as described herein. By way of examples, controller 812 can be configured to control gas flow of a precursor and a reactant into at least one of the one or more reaction chambers to conformally form a silicon carbon nitride layer as described herein.

Controller 812 can include electronic circuitry and software to selectively operate valves, manifolds, heaters, pumps and other components included in system 800. Such circuitry and components operate to introduce precursors, reactants, and purge gases from the respective sources. Controller 812 can control timing of gas pulse sequences, temperature of the substrate and/or reaction chamber, pressure within the reaction chamber, and various other operations to provide proper operation of the system 800.

Controller 812 can include control software to electrically or pneumatically control valves to control flow of precursors, reactants, and/or purge gases into and out of the reaction chamber 802. Controller 812 can include modules, such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 800, substrates, such as semiconductor wafers, are transferred from, e.g., a substrate handling area 823 to the reaction chamber 801. Once substrate(s) are transferred to reaction chamber 801, one or more gases, such as precursors, reactants, carrier gases, and/or purge gases, are introduced into reaction chamber 801.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a conformal silicon carbon nitride layer overlying a gap on a surface of a substrate, the method comprising:
   providing the substrate comprising the gap within a reaction chamber;
   providing at least one of a nitrogen reactant and a noble gas to the reaction chamber;
   providing a silicon precursor to the reaction chamber;
   during an overlap period of the steps of providing at least one of a nitrogen reactant and a noble gas and providing the silicon precursor, providing plasma power for a deposition period to thereby form conformal silicon carbon nitride material within the gap;
   using a plasma process for a treatment period, treating the conformal silicon carbon nitride material to form treated silicon carbon nitride material; and
   repeating the steps of providing plasma power for a deposition period and treating the conformal silicon carbon nitride material to form the conformal silicon carbon nitride layer,
   wherein a temperature within the reaction chamber is less than 400° C.,
   wherein the silicon precursor is represented by the general formulas:

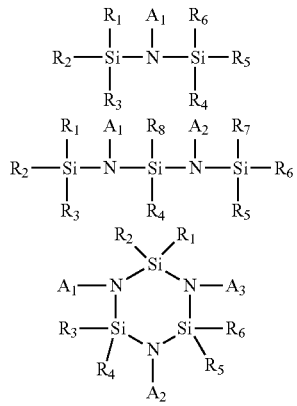

where each $R_1$-$R_8$ is independently selected from groups represented by $C_xN_yH_z$, where x ranges from 0 to about 3, where y ranges from 0 to about 2, and where z ranges from about 3 to about 9; or

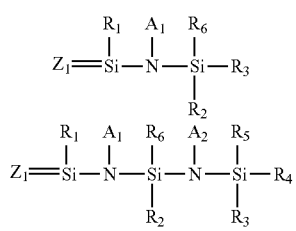

-continued

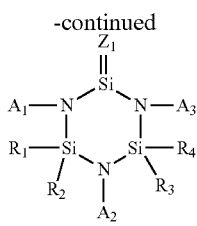

where each $R_1$-$R_6$ is independently selected from groups represented by $C_xN_yH_z$, where x ranges from 0 to about 3, where y ranges from 0 to about 2, and where z ranges from about 3 to about 9; or

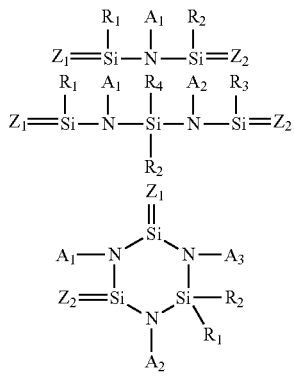

where each $R_1$-$R_4$ is independently selected from groups represented by $C_xN_yH_z$, where x ranges from 0 to about 3, where y ranges from 0 to about 2, and where z ranges from about 3 to about 9, wherein $A_1$-$A_3$ are independently selected from groups comprising at least one of C and H, and wherein $Z_1$ and $Z_2$ comprise C and H.

2. The method of claim 1, wherein a duration of the deposition period is less than 60 seconds.

3. The method of claim 1, wherein a thickness of the carbon nitride material deposited during the deposition period is between about 1 nm and about 6 nm.

4. The method of claim 1, wherein a susceptor temperature within the reaction chamber is between about 50° C. and about 250° C.

5. The method of claim 1, wherein the silicon precursor is represented by the general formulas:

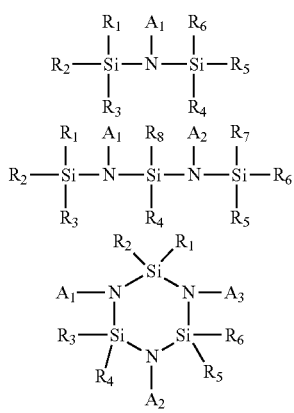

where each $R_1$-$R_8$ is independently selected from groups represented by $C_xN_yH_z$, where x ranges from 0 to about 2, where y ranges from 0 to about 1, and where z ranges from about 3 to about 6; or

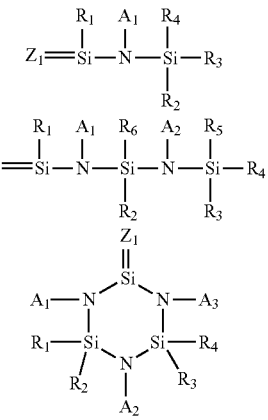

where each $R_1$-$R_6$ is independently selected from groups represented by $C_xN_yH_z$, where x ranges from about 0 to about 2, where y ranges 0 to about 1, and where z ranges from about 3 to about 6; or

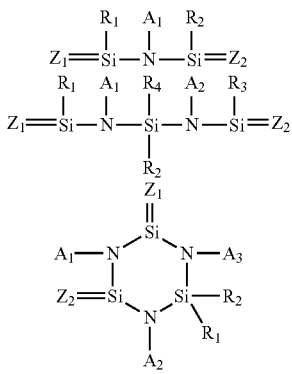

where each $R_1$-$R_4$ is independently from selected groups represented by $C_xN_yH_z$, where x ranges from 0 to about 2, where y ranges from 0 to about 1, and where z ranges from about 3 to about 6.

6. The method of claim 1, wherein the silicon precursor comprises one or more of a Si—C bond and a Si—N bond.

7. The method of claim 1, wherein the nitrogen reactant is selected from the group consisting of $N_2$, $NH_3$, and a mixture of $N_2$ and $H_2$.

8. The method of claim 1, wherein a plasma power during the step of treating the conformal silicon carbon nitride material is higher than a plasma power during the step of providing plasma power for a deposition period.

9. The method of claim 1, wherein the plasma power during the deposition period is between about 50 and about 1000 W.

10. The method of claim 1, wherein a plasma power during the step of treating the conformal silicon carbon nitride material is between about 50 and about 1000 W.

11. The method of claim 1, wherein the noble gas comprises one or more of argon and helium.

12. The method of claim 1, wherein the noble gas comprises argon and helium.

13. The method of claim 1, wherein a hydrogen-containing gas is provided to the reaction chamber during the treatment period.

14. The method of claim 1, wherein a noble treatment gas is provided to the reaction chamber during the treatment period.

15. The method of claim 14, wherein the noble treatment gas comprises helium.

16. The method of claim 1, wherein a thickness of the conformal silicon carbon nitride layer is greater than 0 and less than 20 nm.

\* \* \* \* \*